United States Patent [19]

Urbanek et al.

[11] 4,175,441
[45] Nov. 27, 1979

[54] GAUGE FOR MEASURING DISTANCE TO PLANAR SURFACES AND THICKNESSES OF PLANAR MEMBERS

[75] Inventors: Karel Urbanek, Atherton; George J. Kren, Los Altos; William R. Wheeler, Saratoga, all of Calif.

[73] Assignee: Tencor Instruments, Mountain View, Calif.

[21] Appl. No.: 903,493

[22] Filed: May 8, 1978

[51] Int. Cl.² ............................................. G01N 29/00
[52] U.S. Cl. ...................................................... 73/599
[58] Field of Search ................. 73/579, 584, 597, 599, 73/627, 628, 589; 181/123; 340/1 R, 16 R

[56] References Cited

U.S. PATENT DOCUMENTS

| | | | |
|---|---|---|---|
| 2,268,643 | 1/1942 | Crosby | 73/627 |
| 2,538,444 | 1/1951 | De Mars | 73/599 |
| 2,640,190 | 5/1953 | Rines | 73/628 |
| 2,819,613 | 1/1958 | Neiley | 73/628 |
| 3,228,232 | 1/1966 | Proctor | 73/628 |
| 3,500,301 | 3/1970 | Meier | 73/628 |
| 3,694,800 | 9/1972 | Frank | 340/1 R |
| 3,750,461 | 8/1973 | Felix | 73/597 |

FOREIGN PATENT DOCUMENTS

463123  11/1968  Switzerland .............................. 73/599

*Primary Examiner*—Stephen A. Kreitman
*Attorney, Agent, or Firm*—Thomas Schneck, Jr.

[57] ABSTRACT

Apparatus for measuring distance between a gauge head orifice, and the front planar surface of an object by sensing acoustic pressure near the gauge head orifice. The acoustic pressure is initially generated by an audio oscillator activating a speaker which emits acoustic waves through a first orifice. Acoustic pressure is sensed through a second orifice, proximate to the first, and the pressure is converted to an electrical signal which is processed to yield a distance signal for a display. Two similar distance gauges spaced apart on opposite sides of a planar member at a known distance are used to compute the thickness of the planar member.

23 Claims, 7 Drawing Figures

GAUGE FOR MEASURING DISTANCE TO PLANAR SURFACES AND THICKNESSES OF PLANAR MEMBERS

BACKGROUND OF THE INVENTION a. Field of the Invention

The invention relates to distance measuring instruments and more particularly to a non-contacting gauge for measuring the distance between a gauge head and planar surfaces and for measuring the thickness of a planar member.

b. Prior Art

In the field of non-contacting thickness gauges, a large segment of prior art gauges rely on reflection, scattering or transmission of electromagnetic or nuclear radiation or on eddy currents. Still other gauges rely on acoustic waves, particularly ultrasonic waves for pulse-echo measurements of thickness. One of the problems with prior art pulse-echo devices is that acoustic waves of ultrasonic frequency partially penetrate the object being measured, thereby creating an uncertainty regarding the location of the reflective plane.

By using longer acoustic wavelengths, such as audio wavelengths, the waves can no longer penetrate most materials, but then pulse-echo techniques cannot be used for measurement of small thicknesses and distances, on the order of a few millimeters to a few thousandths of a millimeter, because the distance being measured becomes a small fraction of a wavelength and cannot be accurately resolved. Previously, it was thought that to measure small distances, wavelengths smaller than the distance to be measured were preferred. An alternate gauge, not relying on any wave motion is the air gauge.

In an air gauge an air supply is usually connected to two air channels, one being a reference channel, in which a preset air leak is established from an orifice, the other being a measuring channel having another orifice which is inserted into an object, such as a pipe, at a slight distance therefrom. The rate of leakage in the measuring channel corresponds to a distance from the orifice to the object. Two such orifices, diametrically opposed in a plug are used to measure the inside diameter of bored holes. Certain air gauges of the prior art use the input air supply to operate a differential pressure meter so that differences between the reference channel and the measuring channel can be directly read by a gauge. Prior art air gauges are not limited to measuring inside diameters of pipes. U.S. Pat. No. 3,968,679 teaches a pneumatic sensor head for monitoring the thickness of a continuously moving sheet of material passing through the head. One of the problems with prior art air gauges is that the measuring head must usually be precision machined and a continuous gas supply must be provided, such as by an air tank. Such a requirement limits the portability of the instrument and requires plumbing normally associated with gas supplies, including a master pressure gauge and tubing. Another problem with air gauges is a characteristically short measuring range, typically 0.002 to 0.003 inches.

A more serious problem is that using compressed gases means that a compressor was used to provide the gas supply and very typically compressors introduce measurable quantities of hydrocarbon particles into the gas, particularly droplets of oil. These particles can contaminate surfaces which the gas is blown against. Besides introducing contaminant particles, a gas stream may agitate nearby particles and cause them to adhere to the surface of the object being measured.

The problem of contamination becomes acute in the manufacture of semiconductor integrated circuits. Such circuits are deposited on substrates of silicon whose thickness must be known. Yet because the silicon substrate will eventually contain hundreds of identical integrated circuits, the thickness measurement should be made by a non-contacting gauge which does not introduce any contaminants to the surface of the substrate. A single particle can cause the failure of an entire integrated circuit. Since the value of even one circuit can be substantial, it is important to guard against contaminants, especially particulates. The problem of surface contamination is not unique to integrated circuit manufacture. Other substances and substrates, such as optical materials and solid objects having planar surfaces must often be measured with a non-contacting gauge which does not introduce contaminants to the surface.

SUMMARY OF THE INVENTION

An object of the invention is to devise a non-contacting gauge for measuring the distance from an orifice to a planar surface, without contaminating the surface.

Another object is to devise a distance measuring gauge which is portable and measures only to a planar surface of a member, without penetrating the planar surface of the member, and which may be configured as a thickness gauge. A further object is to devise a distance measuring gauge which has a longer range than prior art air gauges.

The above objects have been met with a gauge which relies upon audio frequency acoustic waves to modulate ambient pressure in a gap between an orifice emitting the acoustic waves and a planar surface. Although the modulation signal is emitted at constant frequency and amplitude by a loudspeaker, the reflected waves have larger amplitudes when the gap is small, smaller amplitudes when the gap is large. A microphone picks up the acoustic waves and converts them to electrical oscillations whose amplitude is proportional to pressure and inversely proportional to the gap dimension. The electrical oscillations are processed by sharp filtering and rectification to produce an electrical d.c. voltage which is fed to a multifunction converter where the signal is converted to a distance measurement which may be used in further signal processing, or displayed or recorded.

In a preferred embodiment, a miniature speaker is mounted in a gauge head, with a conduit transmitting the speaker output through the center of a first orifice of the gauge head. An annular region surrounding the conduit serves as a second orifice for communicating acoustic pressure in the vicinity of the gauge head to a miniature microphone, also mounted in the gauge head. A signal processing means is provided which filters, rectifies and multiplies the electrical signal derived from the microphone into a distance measurement signal.

A pair of non-contacting gauges which measure the distance from an orifice to a planar surface may be spaced apart at a known distance and face each other. Once the distance from the surface of a planar object to each gauge is known, the thickness of the planar object may be calculated by a simple subtractive process. In this manner, a non-contacting thickness gauge is constructed.

DESCRIPTION OF THE PREFERRED EMBODIMENT

Figure 1:
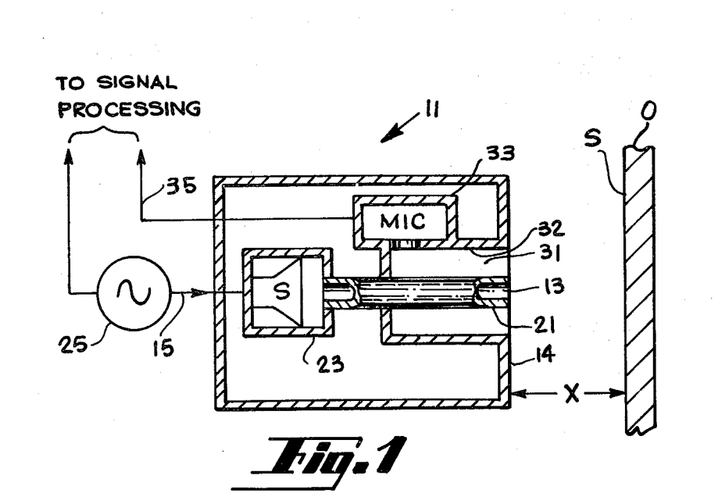
FIG. 1 is a plan view of a gauge head of the present invention positioned for measuring the distance to a planar surface.

With reference to FIG. 1, a side view of a gauge head 11 of the present invention is shown. The head may be cylindrical or prism shaped having two orifices 13, 31 on one end and electrical leads 15, 35 emerging from the rear of the head, although the electrical leads may emerge from any side of the head. In the preferred embodiment, the gauge head is cylindrical with a length of approximately 30 mm and a diameter of approximately 22 mm. These dimensions are examplary. The dimensions selected by a user should be large enough to accommodate the components of FIG. 1 described below, although the components could be located outside of the gauge head if an especially small head is required.

The first orifice 13 is an acoutic wave modulation output located at the end of a conduit or tube 21 which extends from the orifice 13 to a miniature speaker 23. Miniature speaker 23 is a commercially available device measuring approximately 10 mm on a side and approximately 4 mm thick. The speaker is commercially known as a receiver, model BB-1511 available from Knowles Electronics, Inc., Franklin Park, Ill. Speaker 23 is electrically driven by a low power solid state audio oscillator 25 which is connected to speaker 23 by means of a wire pair 15. The frequency of audio oscillator 25 is not critical, but a frequency below 20,000 Hertz is preferred. The exact frequency selected should be one which yields an optimum signal to noise ratio for the entire system, taking into account the sensitivity of an acoustic pickup transducer described below. Orifice 13 is parallel to, but spaced from, a planar surface, S, of an object, O, such as a substrate. Typically, the substrate may be supported by a block or table, not shown.

Figure 2:
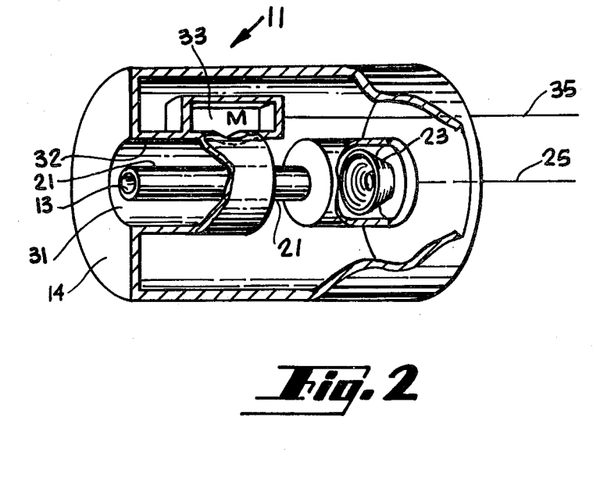
FIG. 2 is a side cut away view of the gauge head shown in FIG. 1, but reversed, left-to-right, in orientation.

The gauge head 11 preferably has a face 14 which is a panel or wall having the orifices 13, 31 defined therein. In FIGS. 1 and 2 face 14 is shown to be annular with orifices 13, 31 defined coaxially in the center thereof. Exemplary dimensions for gauge dimensions are as follows. Head 11 is made cylindrical with a face diameter of 2.2 cm, a first orifice 13 diameter of 1.6 mm surrounded by conduit 21 having a diameter of 2.1 mm. Second orifice 31 coaxially surrounds first orifice 13 and has a diameter of 3.2 mm. These dimensions may be varied by those skilled in the art and are not critical. The diameter of the face, if annular, should be at least two or three times the gap distance to be measured, although for various applications, the shape and size of the head and face could vary considerably.

Figure 4:
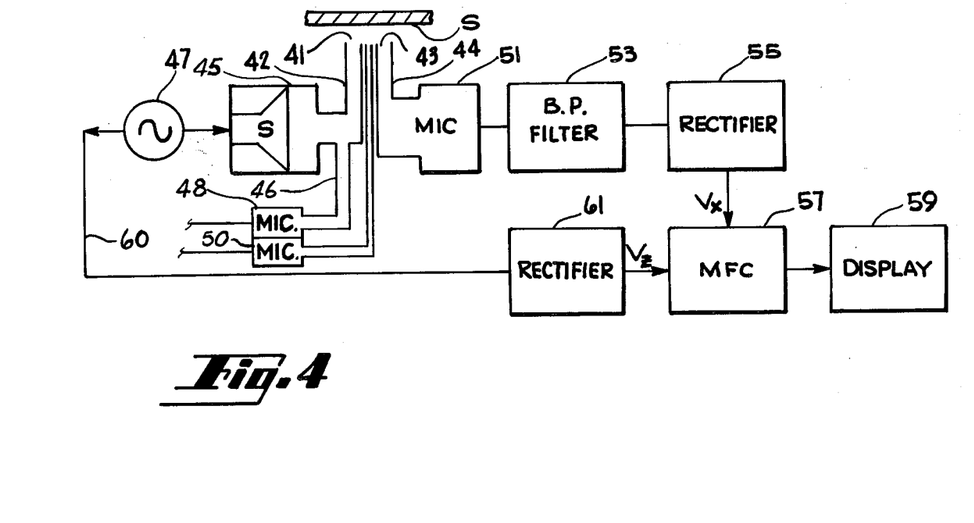
FIG. 4 is an electrical plan of the apparatus of FIG. 1.

While the face 14 is preferable in providing a structure which holds the first and second orifices, face 14 is not essential if the orifices are independently supported, as they are shown in FIG. 4 wherein the orifices 41, 43 are defined at the ends of tubes 42, 44 respectively. The benefit of face 14 is that it increases sensitivity of the apparatus, i.e., the ability of the apparatus to pick up weak signals.

Returning to FIG. 1, second orifice 31 is an acoustic wave input which communicates with the sensitive portion of a microphone 33 through a conduit or tube 32. Microphone 33 is approximately the same size as speaker 23. Such a microminiature microphone is also available from the same supplier mentioned above and has a commercial designation of BA 1502. A pair of wires 35 emerging from microphone 33 is connected to signal processing means described below with reference to FIG. 4.

In operation, the audio oscillator 25 generates an electrical signal having a frequency below 20K Hz and preferably about seven or eight hundred Hertz. Frequency is not critical but frequency and amplitude of oscillations must remain constant during a gap measurement. The electrical signal is transformed into acoustic waves by speaker 23. Acoustic energy is transmitted down conduit 21 to orifice 13. Acoustic pressure is built up between orifice 13 and surface S which appears as a wall or barrier to the gauge head. It is necessary that the surface S be large enough so that some acoustic pressure may be built up. For small surfaces the gauge head must be closer to the surface than for very large surfaces, where the gauge may be further away. In either instance, it is necessary for the gauge to be able to sense pressure between the gauge head and the surface S.

Pressure modulation by acoustic waves in the gap between the gauge head and the surface S is detected through the second orifice 31 which communicates with microphone 33. The amplitude of acoustic waves between the gauge head and surface S is detected by the microphone 33. In contradistinction to the prior art, the present apparatus is not measuring phase changes of waves, or the time of arrival of pulse echos. Rather, it is measuring acoustic pressure between the gauge head and the surface S, of a gaseous sonic medium, such as air in the gap, The apparatus of the present invention will not operate in the absence of a sonic medium, as in a vacuum. There are no restrictions on the sonic medium, except that its properties remain generally constant during the brief measurement interval.

In the apparatus of the present invention, the speaker 23 modulates ambient pressure between the orifices and the surface S with acoustic waves. This modulation may be thought of as an a.c. pressure component being impressed upon a d.c. pressure component, where the speaker modulation is the a.c. pressure component and ambient pressure is the d.c. pressure component. The speaker does not add any ambient pressure but only modulates ambient pressure with acoustic waves. This modulation is detected by a microphone and converted to electrical wave oscillations which are subsequently filtered and rectified to a d.c. voltage, analogous to rectification of radio frequency waves in a simple radio. This d.c. voltage is proportional to the a.c. pressure component in the gap between surface S and the orifices. If the surface S is further away, the amplitude of acoustic waves detected will be smaller than when the surface S is closer to the gauge head. A wire 35 carries away signals from the microphone 33 for signal processing. While a microphone is a preferred acoustic wave detector, other types of transducers which sense acoustic wave amplitude could be used.

FIG. 2 shows a side view of the gauge head of FIG. 1. The head 11 may be seen to be cylindrical with the first orifice 13 located coaxially within the annular second orifice 31. The first orifice need not be within the second orifice, but may be in a side-by-side relationship or other adjacent location. It is necessary that the second orifice be in a position to accurately sense pressure modulation generated by sound waves emitted from the first orifice.

The coaxial joint geometry of FIG. 2 is preferred because the annular second orifice 31 provides a large aperture for receiving reflected energy while limiting the size of the overall gauge head. Tube 32 which defines second orifice 31 may be part of the gauge head body, such as an inside diameter or may be a separate tube mounted in the gauge head. It is desirable to keep the conduit 21 short in order to avoid any unwanted acoustic impedances. Similarly, the microphone 33 communicates directly with the orifice 31 through tube 32 in order to limit the loss of acoustical signal between the orifice and the microphone.

Figure 3:
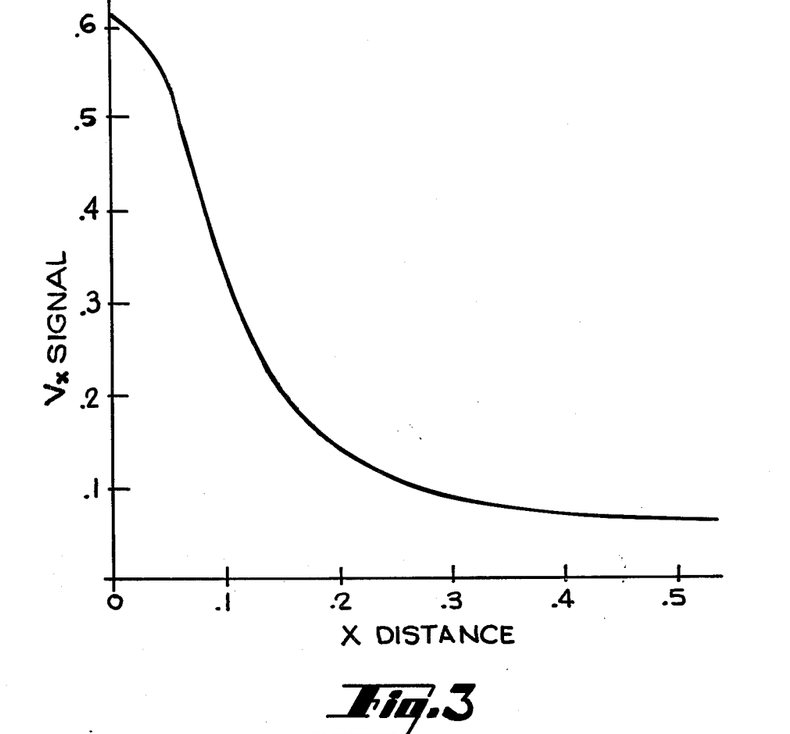
FIG. 3 is a plot of a pressure dependent signal, $V_x$, versus distance between a pressure source and a planar surface.

FIG. 3 is a graph showing the relationship between the amplitude of the d.c. level signal, $V_x$, and the distance, X, between the orifices 13, 31 of FIG. 1 and the surface S. It will be seen that the acoustic signal is maximum at zero distance and diminishes as distance increases. This is a generalized plot for the relationship between a surface S and a gauge head 11, as shown in FIG. 1. The curve which is shown in FIG. 3 has the relationship $V_x = A/(B+X^n)$ where A and B are empirically determined constants dependent on construction geometry, such as size and position of orifices. This is a relationship in which X is determined by the signal processing means of the present invention. One of the advantages of the present invention is the ability to operate anywhere on the curve and beyond the right hand edge, due to mathematical processing of the quantity $V_x$.

With reference to FIG. 4, a surface S is shown to be facing a first orifice 41 which is adjacent to a second orifice 43. Note that in this example, the orifices are not coaxial, but are adjacent to each other. First orifice 41 is connected to speaker 45 through self-supporting or cantilevered tube 42 which is driven by the audio oscillator 47. Acoustic pressure between orifice 41 and surface S is detected by microphone 51 through the second orifice 43 which is connected thereto through self-supporting or cantilevered tube 44. An electrical signal is generated by microphone 51 having an amplitude which is proportional to the amplitude of the detected acoustic pressure from acoustic waves in orifice 43. The detected signal is sharply filtered by the band pass filter 53. Band pass filter 53 is strongly peaked at the frequency of the audio oscillator 47. The filtered signal is transmitted to a fullwave rectifier 55 which has smoothing filters at its output such that the rectified signal is smoothed to a d.c. level which is fed to multifunction converter (MFC) 57.

As mentioned above, our requirement is to solve the equation for X $$V_x = \frac{A}{B + X^n} \tag{1}$$

Multifunction converter 57 solves the equation $$E_o = V_y \left( \frac{V_z}{V_x} \right)^m \tag{2}$$

The electrical output $E_o$ of MFC 57 is proportional to X, the gap distance. This can be demonstrated mathematically by substituting equation (1) into (2) for $V_x$. B is neglected because it is close to zero. The polynomial expansion of (2) yields $E_o = KX^{m.n}$ where K is a constant and $m.n = 1$ because m is so selected. Multifunction converter 57 is preferably a commercial device known as an LH0094 Multifunction converter manufactured by National Semiconductor Corporation of Santa Clara, California, or similar analog multiplying device.

Although not required to calculate the distance between the surface and the gauge head, we have found it preferable to take the output of the audio oscillator 47 through line 60 and connect it to a second rectifier 61, identical to rectifier 55. This enables multifunction converter 57 to execute equation (2) where the scaling term $V_y$ is a reference or calibration voltage, the term $V_z$ is a reference voltage obtained from rectifier 61 and the term $V_x$ is a voltage signal derived from rectifier 55. The purpose for taking another signal from audio oscillator 47 through rectifier 61 is to detect any fluctuations in the oscillator power supply which may cause systematic variations in the signal fed to multiplier 57. By using the ratio $V_z/V_x$, fluctuations will cancel, leaving only the magnitude of the pressure signal in the equation, together with a multiplying constant, $V_y$, as well as the empirically determined exponent m. The multiplying constant $V_y$ adjusts the slope of the desired output signal for driving the display 59.

The exponent "m" of equation (2) must be between 0.1 and 10 according to the manufacturer of the multifunction converter. It has been determined that an optimum value of "m" is 1.1 for the apparatus of FIG. 1 by curve fitting measured values of $V_x$ to values of $V_x$ expressed by equation (1).

In FIG. 4, the reference signal $V_z$ was derived directly from audio oscillator 47 as an electrical signal. There are other ways in which a reference signal could be generated. For example, instead of deriving $V_z$ directly as an electrical signal, it may be derived indirectly in the following manner. The enclosure for speaker 45 may be tapped with a tube or conduit 46 leading to another microphone 48 which directly senses the output of speaker 45 and converts the detected acoustic wave to an electrical signal which is then fed to rectifier 61. In this situation, rectifier 61 would not receive an electrical input along the line 60 from audio oscillator 47.

A variation of an apparatus for deriving the reference signal, $V_z$, is to sample the output of speaker 45 near the orifice 41 of tube 42, but at a known fixed distance from surface S. The microphone 50 would convert detected acoustic signals into electrical signals which are fed to rectifier 61. In the latter two instances where microphones are used to detect acoustic waves from speaker 45, band pass filtering prior to rectification is preferable, using sharp filtering at the frequency of audio oscillator 47.

Figure 5:
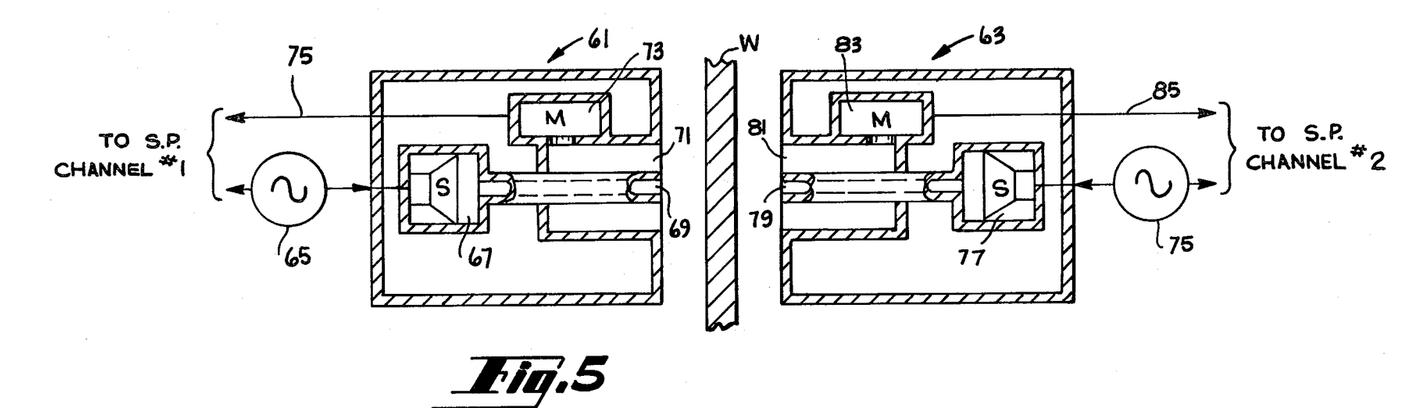
FIG. 5 is a plan view of a thickness gauge utilizing a pair of spaced apart gauge heads of the present invention.

FIG. 5 shows a pair of gauge heads 61, 63 spaced apart on opposite sides of a thin flat member W. Each of the gauge heads 61, 63 is similar to the gauge head described with reference to FIG. 1, except that they should each have speakers driven by audio oscillators at different frequencies. The total distance between the gauge heads is known. Since each gauge head can establish the distance between the head and the surface of member W facing the head the thickness of member W may be computed by a simple subtractive process. Each gauge is connected to a separate signal processing channel so that two head-to-surface measurements may independently be made. Audio oscillator 65 of the first gauge head drives speaker 67 which emits acoustic waves through the first orifice 69. Acoustic pressure between the gauge head and the second orifice 71 is detected by microphone 73 which puts out an electrical signal having an amplitude proportional to the acoustic pressure in the second orifice 71. This electrical signal is transmitted along wire 75 to signal processing channel number 1.

Similarly, the gauge head 63 has an audio oscillator 75 which drives speaker 77 at a different frequency from speaker 67. Speaker 77 puts out acoustic waves through the first orifice 79 which faces the back surface of member W. Acoustic pressure between the surface of member W and the gauge head is sensed through the second aperture 81 which communicates with microphone 83. Microphone 83 converts acoustic pressure amplitude into electrical signals whose amplitude is proportional to pressure which signals are taken along line 85 to the second signal processing channel.

Figure 6:
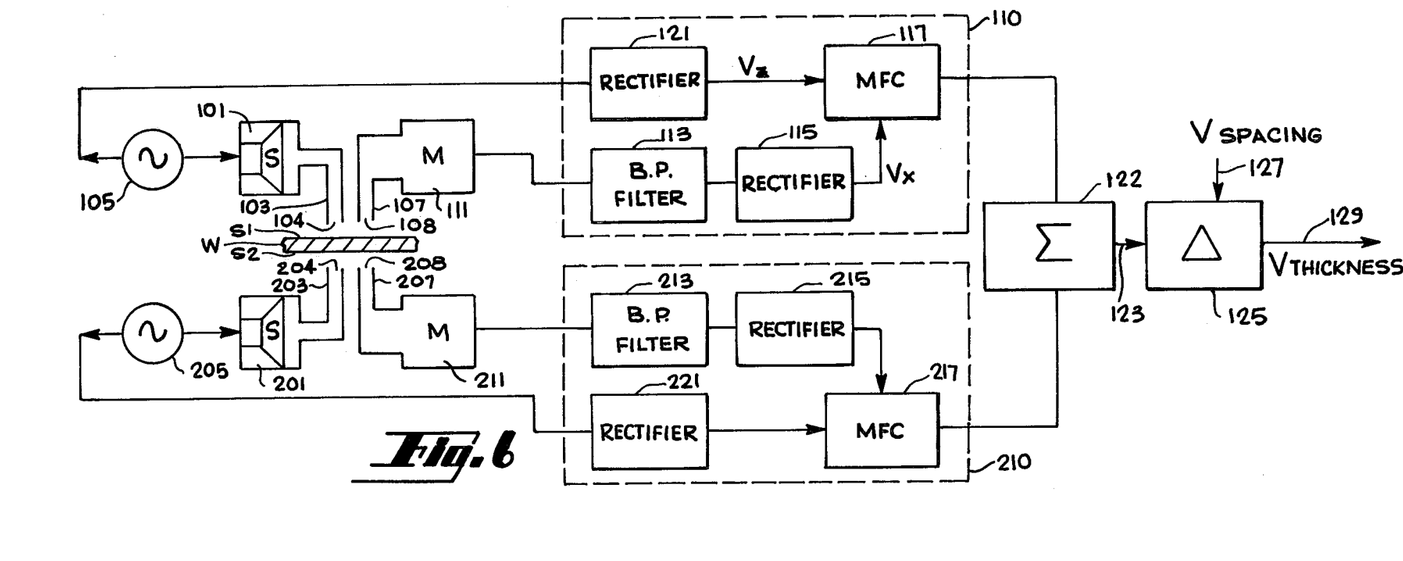
FIG. 6 is an electrical plan for the thickness gauge of FIG. 5, illustrating signal processing means for computing thickness.

With reference to FIG. 6, an electrical plan for the connection of two gauge heads is shown. The gauge heads are similar to the two heads illustrated in FIG. 5 with the exception that a coaxial geometry is not used, although it could be used. In FIG. 6 a first speaker, disposed within an enclosure having a conduit 103 extending therefrom transmits acoustic pressure from the speaker enclosure through the conduit 103 to an orifice 104 facing the surface S1 of a member W.

Adjacent to conduit 103 is conduit 107 which has a second orifice 108 adjacent to orifice 104. The second orifice 108 picks up the acoustic pressure between the first orifice and the surface S1 and transmits the pressure signal through conduit 107 to microphone 111. Microphone 111 produces an electrical signal whose amplitude is proportional to the amplitude of the acoustic pressure sensed in the second orifice 108 connected to microphone 111. The electrical signal is transmitted into a first signal processing channel indicated by the dashed line 110 which includes a sharp band pass filter 113 which is strongly peaked at the frequency of oscillator 105. The filtered signal is transmitted to rectifier 115 which rectifies and smooths the signal to a d.c. level and then transmits the signal to multiplier 117.

Audio oscillator 105, besides driving speaker 101 also provides an oscillator signal to rectifier 121 which is identical to rectifier 115. A rectifier 121 rectifies and smooths the signal received from audio oscillator 105 to a d.c. level and transmits the signal to multifunction converter 117. The multifunction converter 117 performs the same as multifunction converter 57 in FIG. 4 wherein the signal from rectifier 121 is treated as a reference voltage for canceling any variations in the signal received from rectifier 115 which are systematic, for example due to fluctuations in the power supply. The signal received from rectifier 121 is the numerator in the function handled by multifunction converter 117 while the signal received from rectifier 115 is the denominator. The entire expression is operated on by an exponent, n, whose value is determined empirically as previously described. The entire expression may be multiplied by a constant in order to achieve a desired level for transmission to the signal summing unit 122 which may be an operational amplifier.

A second gauge head, identical to the first gauge head is based on the opposite side of the planar member W. Speaker 201 in an enclosure has a conduit 203 leading from the enclosure outwardly toward a surface S2 of member W. The end of conduit 203 terminates in a first orifice 204. The speaker 201 provides acoustic energy to the conduit 203 which is derived from the audio oscillator 205. Acoustic pressure which is built up between the orifice 204 and the surface S2 is detected by a second orifice 208 in the conduit 207 which is connected to microphone 211. Microphone 211 sense pressure amplitude near the first orifice 204 and puts out an electrical signal whose amplitude is proportional to the pressure amplitude near the first orifice 204. The pressure signal from microphone 211 is transmitted to band pass filter 213 which is strongly peaked at the frequency of audio oscillator 205. Note that the frequency of oscillator 205 should be sufficiently different from oscillator 105 that the respective band pass filter 113, 213 can easily separate the two signals if required to do so.

The filtered signal from filter 213 is transmitted to rectifier 215 which rectifies and smooths the electrical signal received therefrom. The smooth signal resembles a d.c. signal and is transmitted to multifunction converter 217. Multifunction converter 217 receives another electrical input from rectifier 221 which is in turn connected to receive a signal from oscillator 205. The signal from oscillator 205 is rectified and smoothed by rectifier 221 in the same way that rectifier 121 operates and the resultant signal is transmitted to the multifunction converter 217 to serve as the numerator of a fraction wherein the signal derived from rectifier 215 is the denominator. The fraction is raised to the n power where n is an exponent (near unity) determined empirically as previously described. The entire function is multiplied by a constant adjusting the amplitude of the entire signal for presentation to the summing amplifier 122. The summing amplifier 122 adds the outputs from the channels 110 and 210, thereby providing a proximity signal which is equal to the distance from each gauge head where the orifices are mounted to a surface of member W facing the gauge head. A signal representing the total distance between heads, $V_{spacing}$, is sent to a difference amplifier 125 and the proximity signal is subtracted from that signal. In other words, the difference amplifier 125 receives a signal representing the total distance from orifice 104 to orifice 204. From that signal is subtracted the signals representing the distance from each orifice and the surface of material W facing a corresponding orifice. The resultant signal represents the thickness of member W. The signal representing the thickness of member W is transmitted on line 129 to a utilization means such as a display unit, a recorder or to some apparatus which can use the thickness signal for further processing.

Note that in the configuration of FIG. 6 the conduit for the speaker and microphone of a gauge head are not concentric, but are mounted adjacent to each other.

The conduits need not be parallel to each other but it is preferable that the orifice of a speaker, for example orifice 104 be adjacent to the second orifice of a microphone, 108 so that the microphone accurately senses changes in pressure between the surface and the first orifice 104 emitting acoustic waves.

Figure 7:
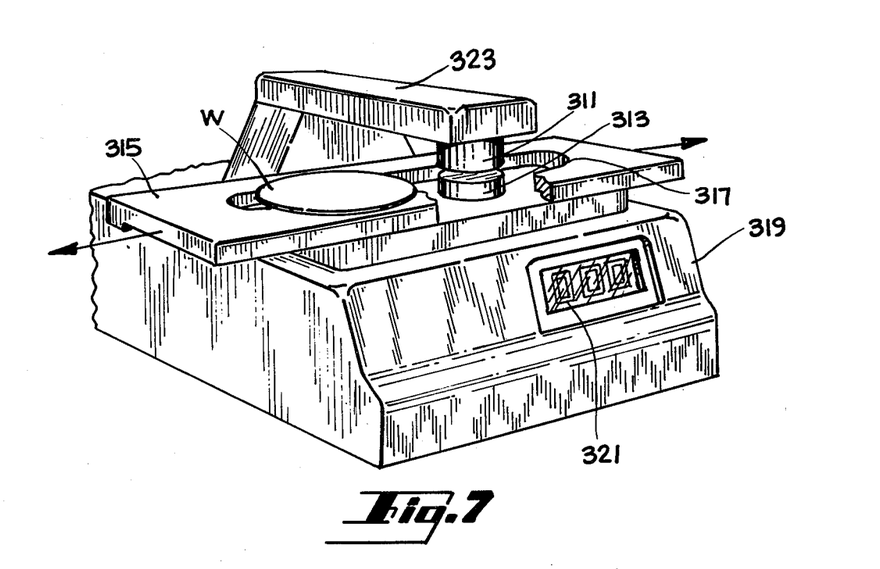
FIG. 7 is a perspective view of a thickness gauge of the present invention.

FIG. 7 illustrates the mechanical construction for a gauge of the type described with reference to FIG. 6. A pair of gauge heads 311, 313 are disposed opposite and facing each other with a gap therebetween. Each gauge has a face defining first and second orifices as previously described. The gap is wide enough to allow a member, such as a silicon wafer, W, to pass therebetween. Wafer W is carried by a reciprocating plate 315 which is driven by a motor which allows various portions of the wafer W to remain stationary between the heads 311, 313 for a measurement to be performed. Carrier 315 has an oval cut out region defined by wall 317 so that the carrier does not interfere with the measurement being made. In FIG. 7, the approximate gap separation of the heads 311, 313 is between 1.1 mm and 1.2 mm with head diameters of approximately 22 mm for measuring the thickness of a member which fits between the heads. The upper surface of carrier 315 is at an elevation a few tenths of a millimeter higher than the face of head 313 so that a member placed on the surface of the carrier will be spaced between the two heads, although it need not be spaced midway therebetween. The circuits shown in FIG. 6 are mounted in a cabinet 319 having a display window 321. The shape of the cabinet and display are selected for aesthetic appeal and are not critical to the operation of the apparatus. Similarly, the cantilever arm 323 supporting head 311 is designed chiefly for convenience and other forms of support for head 311 may be selected. For example, many different types of non-contacting gauges have components mounted above and below moving webs. Many of the support assemblies involved in those gauges could be suitable for mounting the gauge heads of the present invention for measuring thickness. The head or heads may also be arranged to measure lengths of rods, outside diameters and inside diameters of cylinders and other dimensions.

What is claimed is:

1. A gauge for measuring gap distance between a planar surface of an object and an orifice comprising, acoustic means for modulating ambient pressure, said acoustic modulating means having an acoustic output means having a first orifice for emitting acoustic modulation toward the frontal surface of a non-vibrating planar object and establishing acoustic pressure in a gap defined between said acoustic output means and said frontal surface, acoustic modulation detection means having an acoustic input means, including a second orifice for receiving acoustic modulation, operating at the same time as said acoustic output means and disposed proximate to said acoustic output means, said detection means for producing electrical signals representing the amplitude of detected acoustic modulation in said gap, said acoustic output means and said acoustic input means both facing said frontal surface in an acoustic emission, reflection and detection relationship therewith, and signal processing means connected to receive said electrical signals, for producing a gap distance measurement signal from the amplitude of said electrical signals in accord with a known relation.

2. The apparatus of claim 1 wherein said acoustic means for modulating ambient pressure includes a speaker electrically connected to an audio oscillator which supplies a driving signal to said speaker.

3. The apparatus of claim 2 wherein said signal processing means comprises first and second signal processing channels, said first channel comprising a first rectifier adapted to receive said electrical waves for producing a first d.c. signal therefrom, said second channel comprising a second rectifier adapted to receive said driving signal for producing a second d.c. signal therefrom, said first and second d.c. signals transmitted to a multifunction converter having an input and an output, the input connected to receive said first and second electrical signals for forming a ratio of said second signal to said first signal, said ratio cancelling systematic fluctuations in power levels of said first and second electrical signals.

4. The apparatus of claim 3 wherein said second channel is electrically connected directly to said audio oscillator.

5. The apparatus of claim 3 wherein said second channel is acoustically connected to said audio oscillator by means of a microphone disposed a fixed distance from the frontal surface of said planar object.

6. The apparatus of claim 3 wherein said second channel is acoustically connected to said audio oscillator by means of a microphone connected to directly sample the acoustic wave output of said acoustic wave modulation means.

7. The apparatus of claim 2 wherein said acoustic output means includes said first orifice defined at one end of a first tube, the other end of which is connected to said speaker for transmitting acoustic energy therefrom.

8. The apparatus of claim 7 wherein said acoustic wave input means includes said second orifice defined at one end of a second tube, the other end of which is connected to a microphone forming said acoustic pressure detection means.

9. The apparatus of claim 8 wherein said first tube is coaxially disposed within said second tube.

10. The apparatus of claim 1 wherein said acoustic pressure modulation detection means includes a microphone.

11. The apparatus of claim 1 wherein said output means orifice of said acoustic modulating means is disposed within the input means orifice of said acoustic modulation detection means.

12. A thickness gauge for planar objects or continuous sheet material or the like comprising, (a) a pair of distance measuring gauges having gauge heads spaced from each other by a known fixed width, said gauge heads facing an opposite frontal surface of a non-vibrating planar object or sheet material disposed in the fixed width and whose thickness is to be measured, each gauge comprising, acoustic means for modulating ambient pressure, said acoustic modulating means having an acoustic output means disposed in a gauge head for emitting acoustic modulation toward a frontal surface of said non-vibrating planar object and establishing acoustic pressure in a gap defined between said acoustic output means and said frontal surface, acoustic modulation detection means having an acoustic input means operating at the same time as said acoustic output means and disposed proximate to said acoustic output means, said detection means for producing electrical signals representing the amplitude of detected acoustic modulation in said gap, said acoustic output means and said acoustic input means facing said frontal surface in an acoustic emission, reflection and detection relationship therewith, and signal processing means connected to receive said electrical signals for producing a gap distance measurement signal from the amplitude of said electrical signals in accord with a known relation, (b) signal summing means connected to receive gap distance measurement signals from each distance measuring gauge for additively combining said signals and producing an output signal, (c) signal difference means having a first signal input representing the known gauge head fixed width and having as a second signal input, the output of said signal summing means for subtracting said second signal from the first signal, yielding a signal representing thickness.

13. The apparatus of claim 12 wherein said acoustic means for modulating ambient pressure includes a speaker electrically connected to an audio oscillator which supplies a driving signal to said speaker.

14. The apparatus of claim 13 wherein said signal processing means comprises first and second signal processing channels, said first channel comprising a first rectifier adapted to receive said electrical waves for producing a first d.c. signal therefrom, said second channel comprising a second rectifier adapted to receive said driving signal for producing a second d.c. signal therefrom, said first and second d.c. signals transmitted to a multifunction converter having an input and an output, the input connected to receive said first and second electrical signals for forming a ratio of said second signal to said first signal, said ratio cancelling systematic fluctuations in power levels of said first and second electrical signals.

15. The apparatus of claim 14 wherein said second channel is electrically connected directly to said audio oscillator.

16. The apparatus of claim 14 wherein said second channel is acoustically connected to said audio oscillator by means of a microphone disposed a fixed distance from the frontal surface of said planar object.

17. The apparatus of claim 14 wherein said second channel is acoustically connected to said audio oscillator by means of a microphone connected to directly sample the acoustic output of said acoustic modulation means.

18. The apparatus of claim 13 wherein said acoustic output means includes a first orifice defined at one end of a first tube, the other end of which is connected to said speaker for transmitting acoustic energy therefrom.

19. The apparatus of claim 18 wherein said acoustic input means includes a second orifice defined at one end of a second tube, the other end of which is connected to a microphone forming said acoustic pressure detection means.

20. The apparatus of claim 19 wherein said first tube is coaxially disposed within said second tube.

21. The apparatus of claim 12 wherein said acoustic pressure modulation detection means includes a microphone.

22. The apparatus of claim 12 wherein said output means of said acoustic modulating means includes a first orifice disposed within a second orifice included in the input means of said acoustic modulation detection means.

23. A method for measuring between a planar object and an acoustic source and detector comprising, generating continuous acoustic energy in an acoustic source from a first orifice facing a non-vibrating planar object at a gap distance to be measured, whereby acoustic pressure is created in the gap, simultaneously picking up reflected acoustic energy from a second orifice proximate to said acoustic source first orifice and converting said energy to a first electrical signal representing said acoustic pressure, generating a second electrical signal representing acoustic energy output from said acoustic wave source, combining said first and second electrical signals with a reference signal to yield an output signal proportional to gap distance.

* * * * *

UNITED STATES PATENT AND TRADEMARK OFFICE
CERTIFICATE OF CORRECTION

PATENT NO. : 4,175,441
DATED : November 27, 1979
INVENTOR(S) : Karel Urbanek, George J. Kren, William R. Wheeler It is certified that error appears in the above-identified patent and that said Letters Patent are hereby corrected as shown below:

Col. 8, line 21: Change "sense" to "senses".

Col. 12, line 29 (Claim 23): After "measuring", insert "distance".

Signed and Sealed this

Twelfth Day of August 1980

[SEAL]

Attest:

SIDNEY A. DIAMOND

Attesting Officer

Commissioner of Patents and Trademarks